United States Patent
Kamalanathan et al.

(10) Patent No.: US 11,616,195 B2
(45) Date of Patent: Mar. 28, 2023

(54) DUAL OXIDE ANALOG SWITCH FOR NEUROMORPHIC SWITCHING

(71) Applicant: Applied Materials, Inc., Santa Clara, CA (US)

(72) Inventors: Deepak Kamalanathan, San Jose, CA (US); Archana Kumar, Mountain View, CA (US); Siddarth Krishnan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/883,009

(22) Filed: May 26, 2020

(65) Prior Publication Data
US 2020/0395538 A1     Dec. 17, 2020

Related U.S. Application Data

(60) Provisional application No. 62/860,313, filed on Jun. 12, 2019.

(51) Int. Cl.
H01L 45/00     (2006.01)

(52) U.S. Cl.
CPC .......... *H01L 45/085* (2013.01); *H01L 45/146* (2013.01); *H01L 45/1608* (2013.01)

(58) Field of Classification Search
CPC .......................... H01L 45/146; H01L 45/1233
See application file for complete search history.

(56) References Cited

U.S. PATENT DOCUMENTS

| | | | |
|---|---|---|---|
| 10,062,845 B1 * | 8/2018 | Gee | H01L 45/085 |
| 2014/0361864 A1 * | 12/2014 | Fukuda | H01C 17/06 338/20 |
| 2015/0083987 A1 * | 3/2015 | Kakushima | H01L 45/1253 257/4 |
| 2017/0083811 A1 | 3/2017 | Cho et al. | |
| 2017/0271004 A1 * | 9/2017 | Jeon | G11C 13/004 |
| 2018/0277759 A1 * | 9/2018 | Tachikawa | H01L 27/249 |
| 2018/0358470 A1 | 12/2018 | Lee et al. | |
| 2019/0165356 A1 | 5/2019 | Li et al. | |

FOREIGN PATENT DOCUMENTS

| | | |
|---|---|---|
| KR | 2017-0071766 A | 6/2017 |
| KR | 2018-0086152 A | 7/2018 |

OTHER PUBLICATIONS

Yoo et al., Conversion from unipolar to bipolar resistance switching by inserting layer in Pt/TaOx/Pt cells, Appl. Phys. Lett. 98, 183507 (2011) (Year: 2011).*
International Search Report and Written Opinion mailed in International Patent Application No. PCT/US2020/034500, 8 pages.
International Preliminary Report on Patentability dated Dec. 23, 2021 in International Patent Application No. PCT/US2020/034500, 6 pages.

* cited by examiner

*Primary Examiner* — Shih Tsun A Chou
(74) *Attorney, Agent, or Firm* — Kilpatrick Townsend & Stockton LLP (57) ABSTRACT

Exemplary semiconductor structures for neuromorphic applications may include a first layer overlying a substrate material. The first layer may be or include a first oxide material. The structures may include a second layer disposed adjacent the first layer. The second layer may be or include a second oxide material. The structures may also include an electrode material deposited overlying the second layer.

10 Claims, 6 Drawing Sheets

DUAL OXIDE ANALOG SWITCH FOR NEUROMORPHIC SWITCHING

CROSS REFERENCES TO RELATED APPLICATIONS

This application claims the benefit of priority to U.S. Provisional Patent Application No. 62/860,313 filed Jun. 12, 2019, the contents of which are hereby incorporated by reference in their entirety for all purposes.

TECHNICAL FIELD

The present technology relates to semiconductor processes and equipment. More specifically, the present technology relates to producing semiconductor devices for neuromorphic applications.

BACKGROUND

Integrated circuits are made possible by processes which produce intricately patterned material layers on substrate surfaces. Producing patterned material on a substrate requires controlled methods for deposition and removal of materials. However, with new device designs, producing high quality layers of material includes new challenges.

Thus, there is a need for improved systems and methods that can be used to produce high quality devices and structures. These and other needs are addressed by the present technology.

SUMMARY

Exemplary semiconductor structures for neuromorphic applications may include a first layer overlying a substrate material. The first layer may be or include a first oxide material. The structures may include a second layer disposed adjacent the first layer. The second layer may be or include a second oxide material. The structures may also include an electrode material deposited overlying the second layer.

In some embodiments, the first layer may be formed in contact with the substrate material. The substrate material in contact with the first layer may be or include an electrode material. The electrode material may be or include at least one of platinum, titanium nitride, or tantalum nitride. The first oxide material and the second oxide material may be or include one or more of titanium oxide, hafnium oxide, silicon oxide, zirconium oxide, aluminum oxide, magnesium oxide, tantalum oxide, dysprosium oxide, scantium oxide, or lanthanum oxide. The first layer may be or include silicon oxide, and the second layer may be or include titanium oxide. The structures may also include a resistive material disposed between the first layer and the substrate material. The resistive material may be or include one or more of silicon, germanium, gallium, or carbon. The resistive material may be or include amorphous silicon. A set and reset current for the semiconductor structure at 1 V turn-on voltage may be less than or about 100 µA.

The present technology may also encompass methods of forming a device for neuromorphic applications. The methods may include forming a layer of a silicon-containing material overlying a substrate. The substrate may be or include a metal electrode material over which the silicon-containing material is formed. The methods may include forming a layer of a metal-oxide material overlying the silicon-containing material.

In some embodiments the silicon-containing material may be or include amorphous silicon, and forming the layer of the metal-oxide material may cause the amorphous silicon to transition to silicon oxide. The silicon oxide may be characterized by a thickness of less than or about 2 nm. The at least a portion of amorphous silicon may be maintained proximate the metal electrode material during the transition. The metal electrode material may include at least one of platinum, titanium nitride, or tantalum nitride. The metal-oxide material may be or include one or more of titanium oxide, hafnium oxide, zirconium oxide, tantalum oxide, dysprosium oxide, scantium oxide, or lanthanum oxide. The methods may also include forming an additional electrode material overlying the metal-oxide material. The metal-oxide material may be characterized by a thickness greater than or about 5 nm. The neuromorphic device formed may be characterized by bulk switching over filamentary switching within the neuromorphic device. The device formed may be characterized by a set and reset current for the neuromorphic device at 1 V turn-on voltage of less than or about 100 µA.

Such technology may provide numerous benefits over conventional systems and techniques. For example, the processes may produce structures capable of including multiple bits per cell operation based on multiple intermediate states of operation between a high current and low current state. Additionally, the processes may provide increased stability of intermediate states over conventional devices. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As devices produced in semiconductor processing continue to shrink, alternative structures are being sought to increase the capabilities of devices, while continuing to reduce device footprints. For example, conventional memory structures include particular limitations. Dynamic random-access memory is a structure that, although characterized by relatively beneficial speed, is volatile. Accordingly, the memory tends to lose data when system power is off. Flash memory does not suffer from this loss, and maintains data throughout power cycling, however, the process of reading and writing is performed in multiple cycles, which may be a slower process. Accordingly, improved memory structures are being developed with a variety of newer material layers. For example, conductive bridging RAM, oxide RAM, magnetic RAM, correlated electron RAM, resistive RAM, and other memory structures are being developed. Many of these structures include new material layers utilizing transition metals or metalloids, which may boost operational characteristics of produced cells.

In general, a dielectric material in metal-insulator-metal or resistive memory structures is switched between a high resistance state and a lower resistance state by application of a voltage across the metal electrodes. By applying a voltage, such as a set voltage, a conductive path may be formed through the dielectric material that can be homogenous or localized. This path may be due to a phase change, formation of a filament, electroformation, or metal-insulator transition, which may allow the materials to operate as one or both of a memory or switch. By breaking the conduction path, such as with a reset, the material may revert to the higher resistance state.

These resistive memory structures often operate by producing a filament or conductive path between the electrodes. However, such operation to produce these filaments may incur a fundamental conductance constraint with a high on-off dynamic range that may limit the cell to 1-bit data, as stable intermediate states may be difficult to maintain. For example, conventional filamentary devices may include a metal-oxide material between two electrodes. Because of the properties of the oxide, when insufficient voltage is applied, no conductive path may be present, which may be the device low-current state, or high resistance state. Upon application of sufficient voltage pulses, a conductive filament may form that may quickly transition the device to a high current state, or low resistance state. These two stable states may be the data 0 or 1 storages, producing a 1-bit cell. Because of the threshold and switching operations, intermediate storage states may often be incapable of being maintained, causing these devices to be limited to 1-bit data.

To increase storage to 2-bit data or 4-bit data per cell, $2^{\wedge}$(number of bit) stable storage levels may be provided. While resistive RAM as noted above may not be capable of producing these states, cells for neuromorphic applications may improve on storage and capability by increasing the number of stable storage values between the 0 and 1 low and high current states. The present technology overcomes issues related to filamentary resistive RAM by producing more than two stable storage states per cell. By forming a dual-oxide structure that is characterized by set and reset currents that may be one or more orders of magnitude lower than conventional resistive RAM, multiple intermediate states may be provided to increase storage to 4, 8, 16 or more levels of storage.

Although the remaining disclosure will routinely identify specific structures, such as switches, for which the present structures and methods may be employed, it will be readily understood that the systems and methods are equally applicable to any number of structures and devices that may benefit from the capabilities or characteristics of the developed devices. Accordingly, the technology should not be considered to be so limited as for use with any particular structures alone. Moreover, although an exemplary tool system will be described to provide foundation for the present technology, it is to be understood that the present technology can be produced in any number of semiconductor processing chambers and tools that may perform some or all of the operations to be described.

Figure 1:
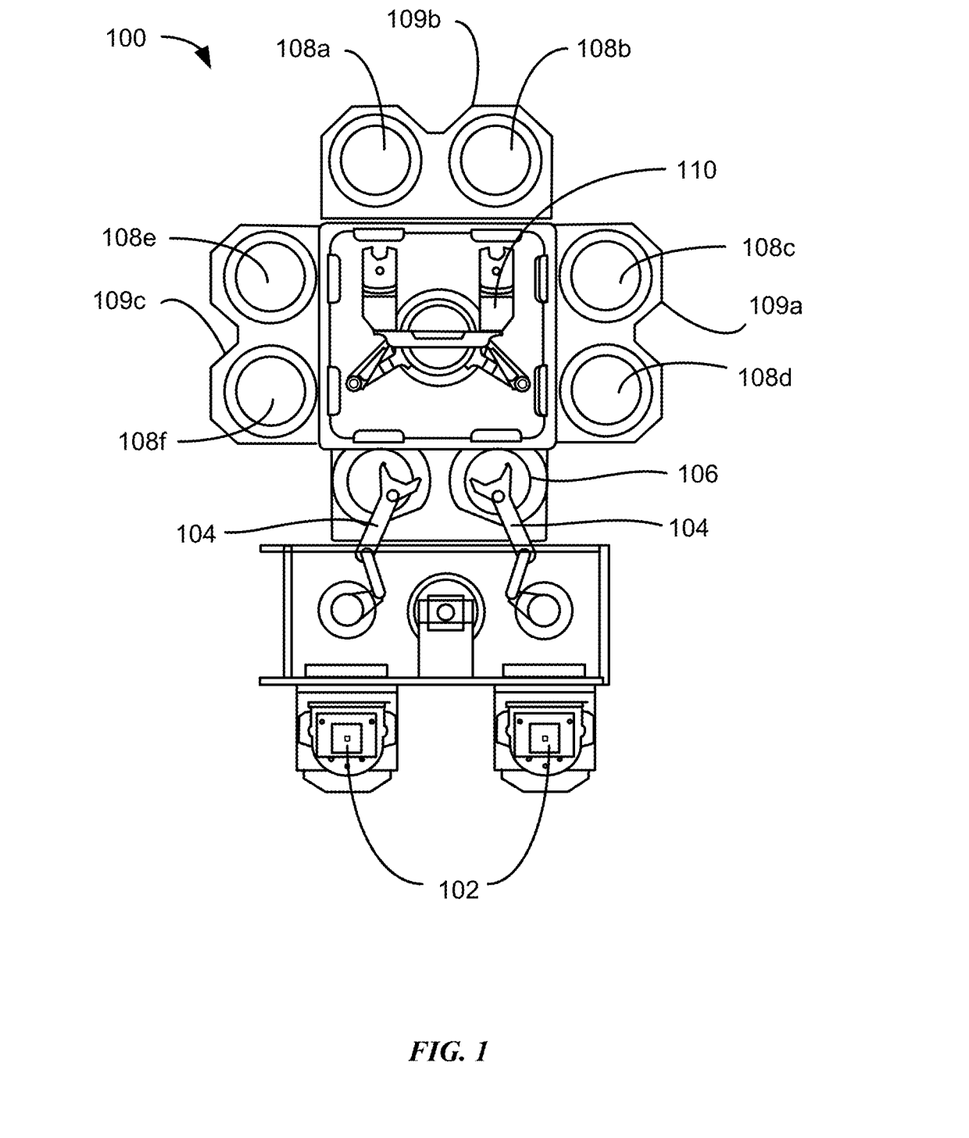
FIG. 1 shows a top plan view of one embodiment of an exemplary processing system according to some embodiments of the present technology.

FIG. 1 shows a top plan view of one embodiment of a processing system 100 of deposition, etching, baking, and curing chambers according to some embodiments of the present technology, and which may be specifically configured to perform some or all of the operations described below. In the figure, a pair of front-opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. Although a tandem system is illustrated, it is to be understood that platforms incorporating standalone chambers are equally encompassed by the present technology. A second robotic arm 110 may be used to transport the substrate wafers from the holding area 106 to the substrate processing chambers 108a-f and back. Each substrate processing chamber 108a-f, can be outfitted to perform a number of substrate processing operations including any number of deposition processes including cyclical layer deposition (CLD), atomic layer deposition (ALD), chemical vapor deposition (CVD), physical vapor deposition (PVD), as well as etch, pre-clean, anneal, plasma processing, degas, orientation, and other substrate processes.

The substrate processing chambers 108a-f may include one or more system components for depositing, annealing, curing and/or etching a material film on the substrate or wafer. In one configuration, two pairs of the processing chambers, e.g., 108c-d and 108e-f, may be used to deposit material on the substrate, and the third pair of processing chambers, e.g., 108a-b, may be used to cure, anneal, or treat the deposited films. In another configuration, all three pairs of chambers, e.g., 108a-f, may be configured to both deposit and cure a film on the substrate. Any one or more of the processes described may be carried out in additional chambers separated from the fabrication system shown in different embodiments. It will be appreciated that additional configurations of deposition, etching, annealing, and curing chambers for material films are contemplated by system 100. Additionally, any number of other processing systems may be utilized with the present technology, which may incorporate chambers for performing any of the specific operations. In some embodiments, chamber systems which may provide access to multiple processing chambers while maintaining a vacuum environment in various sections, such as the noted holding and transfer areas, may allow operations to be performed in multiple chambers while maintaining a particular vacuum environment between discrete processes.

Figure 2:
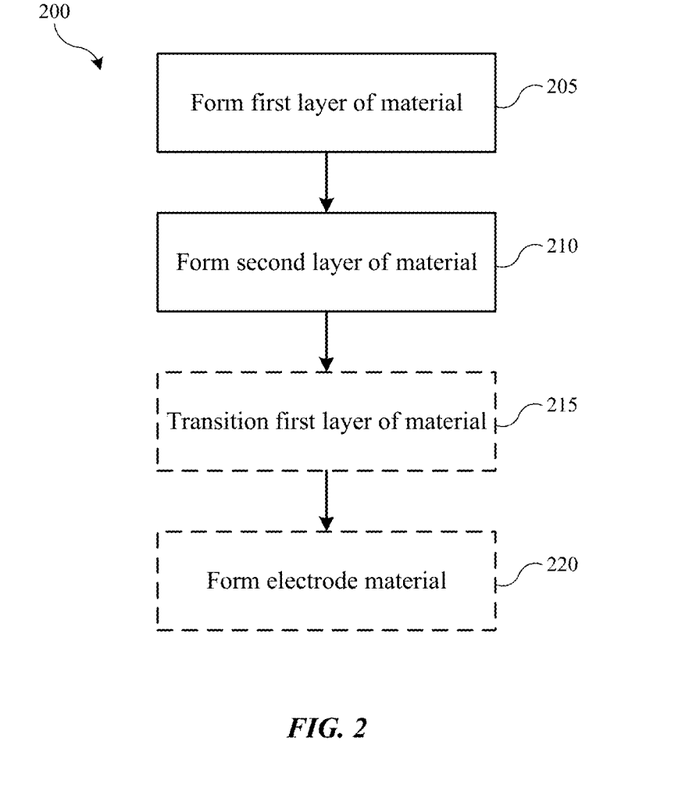
FIG. 2 shows exemplary operations in a method of producing a structure for neuromorphic applications according to some embodiments of the present technology.

System 100, or more specifically chambers incorporated into system 100 or other processing systems, may be used to produce structures according to some embodiments of the present technology. FIG. 2 shows exemplary operations in a method 200 of forming a semiconductor structure for neuromorphic applications according to some embodiments of the present technology. Method 200 may be performed in one or more processing chambers, such as chambers incorporated in system 100, for example. Method 200 may or may not include one or more operations prior to the initiation of the method, including front-end processing, deposition, etching, polishing, cleaning, or any other operations that may be performed prior to the described operations. The method may include a number of optional operations as denoted in the figure, which may or may not be specifically associated with some embodiments of methods according to the present technology. Method 200 describes operations shown schematically in FIGS. 3A-3D, the illustrations of which will be described in conjunction with the operations of method 200. It is to be understood that FIG. 3 illustrates only partial schematic views with limited details, and in some embodiments a substrate may contain any number of transistor or semiconductor sections having aspects as illustrated in the figures, as well as alternative structural aspects that may still benefit from any of the aspects of the present technology.

Figure 3A:
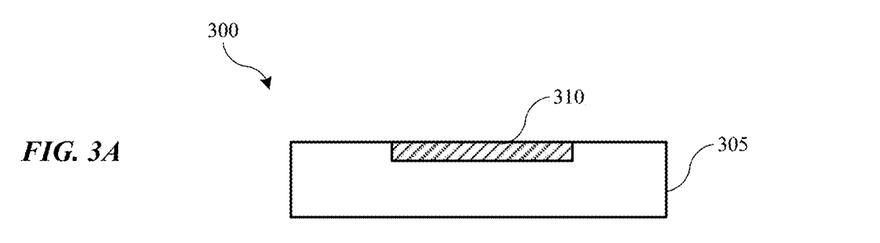
FIGS. 3A-3D show cross-sectional views of substrates being processed according to some embodiments of the present technology.

Method 200 may involve optional operations to develop the semiconductor structure to a particular fabrication operation. Although in some embodiments method 200 may be performed on a base structure, in some embodiments the method may be performed subsequent transistor or other material formation. As illustrated in FIG. 3A, the semiconductor structure may represent a device 300 after front-end or other processing has been completed. For example, substrate 305 may be a planar material, or may be a structured device, which may include multiple materials configured as posts, trenches, or other structures as would be understood are similarly encompassed by the present technology. Substrate 305 may include any number of conductive and/or dielectric materials including metals, which may include transition metals, post-transition metals, metalloids, oxides, nitrides, and carbides of any of these materials, as well as any other materials that may be incorporated within a structure.

One or more material layers may be formed over some or all of substrate 305, as well as formed at least partially within the substrate, to produce a structure that may be a planarized conductive material within a dielectric material in embodiments. For example, in some embodiments an electrode material 310 may optionally be formed overlying substrate 305, or recessed within a portion of substrate material 305. As one non-limiting example, at the exposed surface of substrate 305 may be a dielectric material, such as silicon oxide or any other dielectric, in which the conductive material may be formed. The electrode material 310 may be a continuous layer across the substrate, or may be intermittently formed across the surface of the substrate as illustrated. In one non-limiting example, the conductive material may be or include a metal that may be formed intermittently across the substrate 305. The metal may include tantalum, praseodymium, hafnium, titanium, iridium, rhodium, platinum, or any other material that may operate as an electrode in a memory structure or may be present in alternative structures, for example, and may include a combination of materials as well as oxides or nitrides of any of these materials in some embodiments.

The electrode material 310 may be etched, planarized, or otherwise processed to produce an intermittent pattern in some embodiments, which either through etching or other formation may expose a portion of substrate 305 between segments of electrode material 310. Although illustrated as a single instance, it is to be understood that any number of sections of electrode material 310 may be included. Additionally, although schematically illustrated as including straight sidewalls, the formation or removal process of electrode material 310 may produce angled sidewalls. Thus, in some embodiments, the segments of electrode material 310 may be characterized by a frustum shape, or by an angled surface along one or more faces of the segments. Substrate 305, which may include electrode material 310, may be housed or positioned in a processing region of a semiconductor processing chamber, and method 200 may be performed to form a semiconductor structure for neuromorphic applications on the substrate.

Figure 3B:
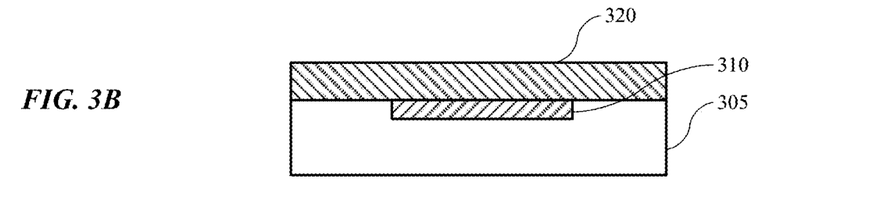

Method 200 may include forming a layer of a first oxide material overlying the substrate and electrode material 310 in operation 205. The first oxide material may be or include a number of materials that may operate with a second oxide material to produce a switching material between electrodes of a structural device. The first oxide material may be formed across the electrode material 310, as illustrated in FIG. 3B with first oxide material 320, and may extend fully across the material to overlie both regions of electrode material 310 as well as substrate material 305.

The first oxide material may be formed by any number of deposition techniques including chemical vapor deposition, physical vapor deposition, or atomic layer deposition. Additionally, the first oxide material may be produced by a transition operation as explained below, in which a material, which may not include oxygen, may first be formed followed by a secondary operation to transition the material to a first oxide material. The first oxide material may be or include one or more metals or metal oxide materials including transition metals, metalloids, or poor metals. Exemplary materials from this list, which are not to be considered limiting, include titanium oxide, hafnium oxide, silicon oxide, zirconium oxide, aluminum oxide, magnesium oxide, tantalum oxide, dysprosium oxide, scantium oxide, or lanthanum oxide, which may include any oxidation states or compounds of the materials.

Method 200 may also include forming a layer of a second oxide material adjacent or in contact with the first oxide material at operation 210. The second oxide material may be the same or different from the first oxide material, and in some embodiments may also include any of the formation operations and materials noted above. In some embodiments of the present technology the second oxide material may be selected with the first oxide material based on oxygen affinity between the materials. For example, the first oxide material may provide a weak oxygen-exchange layer facilitating analog bulk switching across the material layer as opposed to filament formation. Accordingly, the first oxide material and the second oxide material may be selected based on affinity for oxygen exchange between these layers, which may produce a volume switching layer and limit or prevent filament formation through the switching materials, which may impede stability of intermediate layers as described above. Additionally, by producing oxygen exchange layers according to embodiments of the present technology, the bulk switching may be performed at lower set and reset currents, and which may be lower by orders of magnitude compared to filamentary devices.

To accommodate oxygen affinity, in some embodiments the second oxide material may be characterized by a higher affinity to oxygen than the first oxide material. Additionally, the first oxide material may be characterized by a sufficient affinity to oxygen to produce a specific retention to oxygen. For example, in one non-limiting example, and understanding that a number of other material pairs may be used, the first oxide material may be or include silicon oxide, and the second oxide material may be or include titanium oxide. Titanium oxide may be characterized by a higher affinity to oxygen, which may facilitate an initial state of incorporation with titanium. Additionally, titanium may readily donate oxygen to silicon when a sufficient turn-on voltage is applied. Finally, silicon may be characterized by a sufficient affinity to oxygen to retain the oxygen once delivered. For example, when the silicon of this example is replaced with germanium, germanium may be characterized by lower affinity, and may not retain oxygen sufficiently when voltage is removed, essentially forming a volatile memory, which may not afford analog bulk switching according to embodiments of the present technology.

The thickness of the layers produced may additionally impact the described operation, and thus in some embodiments the second oxide layer may be more than or about twice the thickness of the first oxide layer. In some embodiments, the second oxide layer may be at least or about 3 times the thickness of the first oxide layer, at least or about 4 times the thickness, at least or about 5 times the thickness, at least or about 6 times the thickness, at least or about 7 times the thickness, at least or about 8 times the thickness, at least or about 10 times the thickness, at least or about 12 times the thickness, at least or about 15 times the thickness, at least or about 20 times the thickness, or more.

For example, in some embodiments the first oxide layer, which may be silicon oxide as one example, may be characterized by a thickness of less than or about 5 nm, and may be characterized by a thickness of less than or about 4 nm, less than or about 3 nm, less than or about 2 nm, less than or about 1 nm, less than or about 0.5 nm, or less. However, maintaining the first oxide layer within a suitable range may facilitate bulk switching. For example, when the first oxide layer increases above or about 5 nm, the current profile may be too low for the device to function sufficiently. Additionally, if the thickness decreases below or about 1 nm or 0.5 nm, oxygen exchange between the layers may not occur, and a more filamentary effect may occur.

In some embodiments the first layer may be directly contacting the electrode material. In some embodiments an additional resistive layer may be incorporated between the first layer and the electrode material. The resistive material may improve bulk switching by further tuning a current/voltage profile of the materials. Without wishing to be bound by any particular theory, incorporating a resistive material may provide a series resistor to the switching structure, which may control over-programming the switching material, and control intermediate switching states. Resistive materials may be amorphous or some crystalline materials disposed between the electrode material and the first oxide material.

Exemplary materials may include any metalloids, poor metals, or other materials, that may further tune the structure. In one embodiment, the resistive material may be a chalcogenide, such as carbon, silicon, germanium, or tin, for example. Additional materials may be or include materials providing similar or other resistive properties, which may include materials such as gallium, vanadium, niobium, and combination materials, such as silicon germanium, among a number of other materials that may similarly operate to adjust resistance through the structure. The resistive layer may be formed to a thickness to facilitate control over the voltage profile of the device. Consequently, to produce adequate effect, the resistive layer may be greater than or about 2 nm, and in some embodiments may be greater than or about 3 nm, greater than or about 4 nm, greater than or about 5 nm, greater than or about 6 nm, greater than or about 8 nm, greater than or about 10 nm, or more.

Producing the resistive layer of material may occur in one or more ways, including deposition or formation by any of the methods described above. In this way, FIG. 3B may illustrate a resistive layer of material formed over the bottom electrode in some embodiments. Additionally, in some embodiments this resistive material may be used to form the first oxide material. For example, although any of the first oxide materials may be deposited over the electrode material or a resistive material, in some embodiments a transition may be performed at optional operation 215 of method 200. As one non-limiting example, and continuing the previously noted materials, silicon, such as amorphous silicon may be deposited on the electrode over the substrate. When the second layer of material is formed, such as titanium oxide, a portion of the amorphous silicon may transition to silicon oxide. In some embodiments the entire thickness of amorphous silicon may be transitioned to silicon oxide, although in some embodiments an amount of amorphous silicon may be maintained between the produced silicon oxide and the electrode material.

Figure 3C:
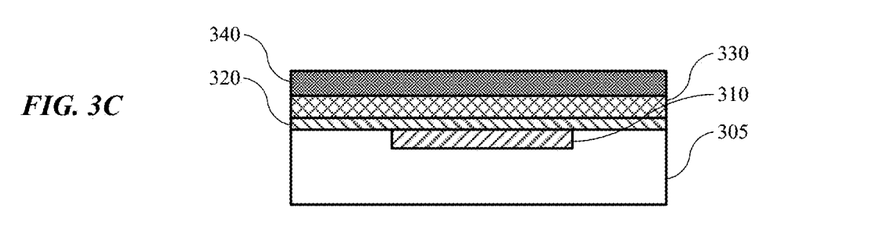
Figure 3D:
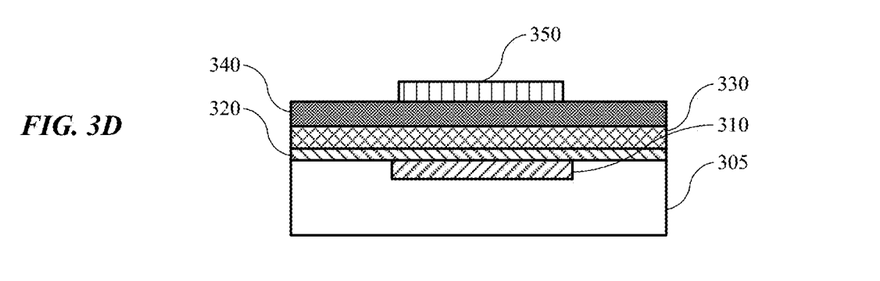

Consequently, FIG. 3C may illustrate multiple embodiments. For example, layer 320 may be a first oxide material as discussed previously, and layer 330 may optionally not be included. In some embodiments layer 320 may be a resistive layer deposited over the substrate, and in some embodiments layer 330 may be a first oxide material formed over the resistive material. In some embodiments layer 340 may be a second oxide material formed over the first oxide material, although as noted above, in some embodiments second oxide material layer 340 may be formed directly overlying the resistive material, which may transition some or all of the resistive material to the first oxide material as explained previously. In optional operation 220 of method 200 an additional electrode material may be formed overlying the second oxide material, and may be any of the electrode materials previously described. As illustrated in FIG. 3D, electrode material 350, which may be the same or different from electrode material 310, may be formed overlying second electrode material 340. Devices encompassed by FIG. 3D may not include all layers illustrated, which may accommodate each of the noted variations described above depending on the incorporation of resistive material and/or a transition operation to produce a first oxide material.

Figure 4:
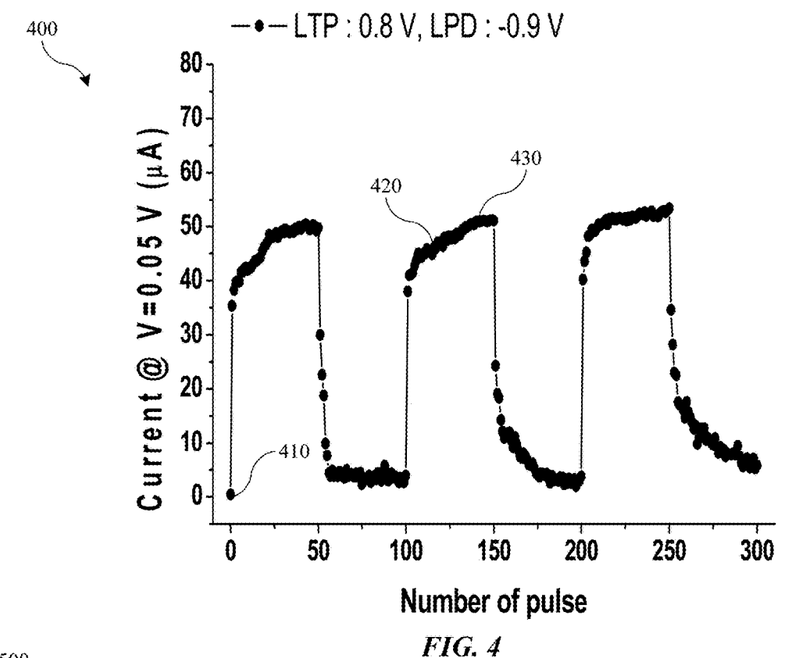
FIG. 4 shows a chart of filamentary device operation according to some embodiments of the present technology.

FIG. 4 shows a chart 400 of filamentary device operation according to some embodiments of the present technology. As noted previously, the present technology may perform analog bulk switching as compared to the filamentary device switching illustrated in FIG. 4, which may be produced based on the structures or thicknesses of the material layers. As previously discussed, filamentary devices may be characterized by more abrupt changes characteristic of a high dynamic on-off range. As illustrated, when no filament exists, the device may be in a low current state, or high resistance state, as illustrated at 410. As voltage is applied to the device sufficient to produce a filament, an abrupt change in current state occurs, which may almost fully switch the device to a high current state, as illustrated at 420. As additional voltage is pulsed, a thicker filament may be produced increasing the current state, although still within a range of a high current position, as illustrated at 430. Consequently, almost or no intermediate states occur between the low current state and the high current state due to the nature of the switching element.

Figure 5:
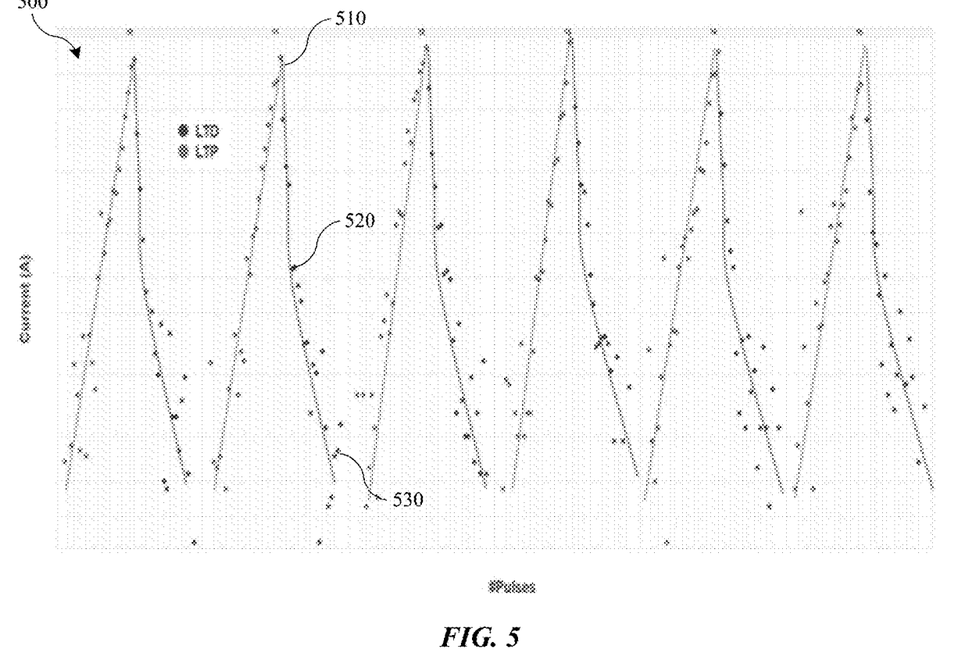
FIG. 5 shows a chart of structures performing neuromorphic operations according to some embodiments of the present technology.

FIG. 5 shows a chart 500 of device operations for neuromorphic applications according to some embodiments of the present technology. Chart 500 may illustrate the multiple intermediate states available between a high current on state and a low current off state for volume switching or analog switching devices according to some embodiments of the present technology. As illustrated at 510, as voltage is pulsed across the device a low current state may be formed based on a relatively thin depletion layer between a first oxide material and a second oxide material. As voltage is continued to be pulsed, an intermediate, stable, higher current state 520 may be produced related to the amount of depletion extending into the first oxide material. Because this depletion layer may be controlled in structures according to embodiments of the present technology, the intermediate locations may be stabilized. As voltage is continued to be applied to the device, the device may transition through multiple additional stable states as shown before reaching a highest current state 530 for the device. Devices according to the present technology may be characterized by controlled transitions between stable intermediate states between a low current state and a high current state.

Figure 6:
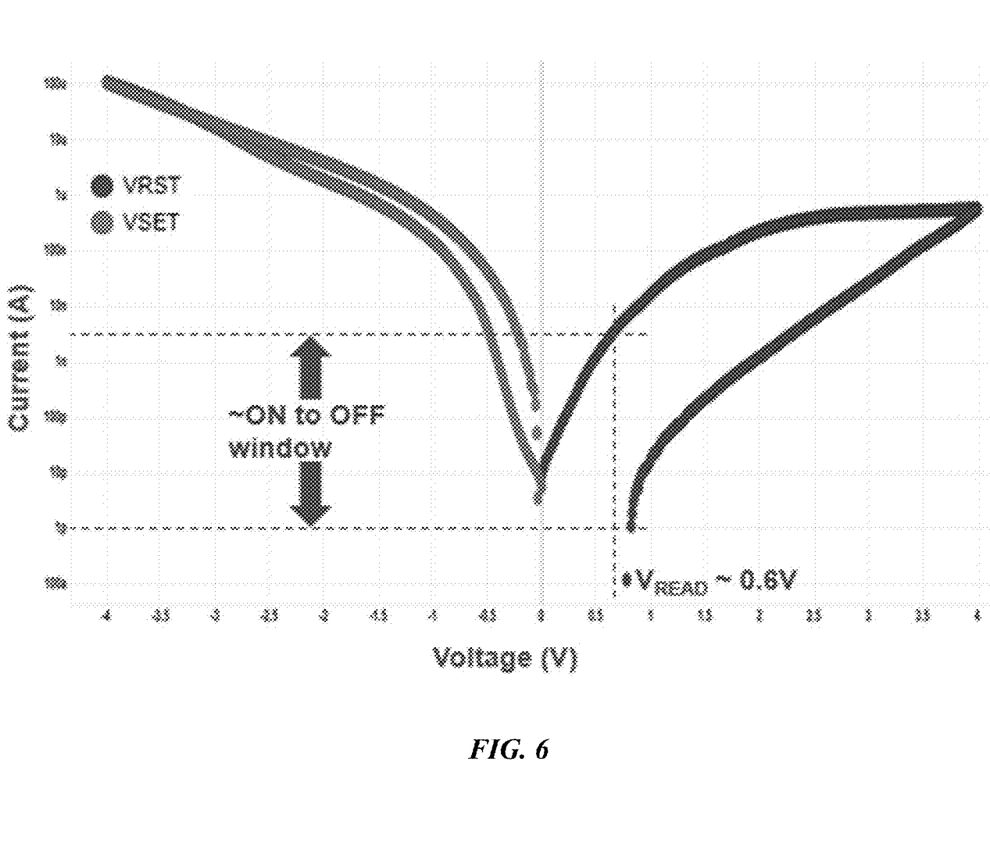
FIG. 6 shows a chart of structures performing neuromorphic operations according to some embodiments of the present technology.

FIG. 6 shows a chart 600 of device operations for neuromorphic applications according to some embodiments of the present technology. Chart 600 may illustrate current-voltage characteristics of devices according to some embodiments of the present technology as illustrated on a logarithmic scale. As illustrated, devices for neuromorphic applications according to the present technology may be characterized by lower set and reset currents than conventional devices. For example, at a turn-on voltage of 1 V, many filamentary RAM devices may be characterized by set and reset currents greater than or about 100 µA, and may be characterized by set and reset currents greater than or about 500 µA, greater than or about 1 mA, greater than or about 10 mA, or greater. Devices according to some embodiments of the present technology may be characterized by lower set and reset currents as illustrated. For example, at a turn-on voltage of 1 V, devices according to some embodiments of the present technology may be characterized by set and reset currents less than or about 100 µA, and for this and other operational turn-on voltages may be characterized by set and reset currents less than or about 50 µA, less than or about 20 µA, less than or about 10 µA, less than or about 5 µA, less than or about 1 µA, less than or about 0.5 µA, less than or about 0.1 µA, less than or about 0.05 µA, less than or about 0.01 µA, or less.

Figure 7A:
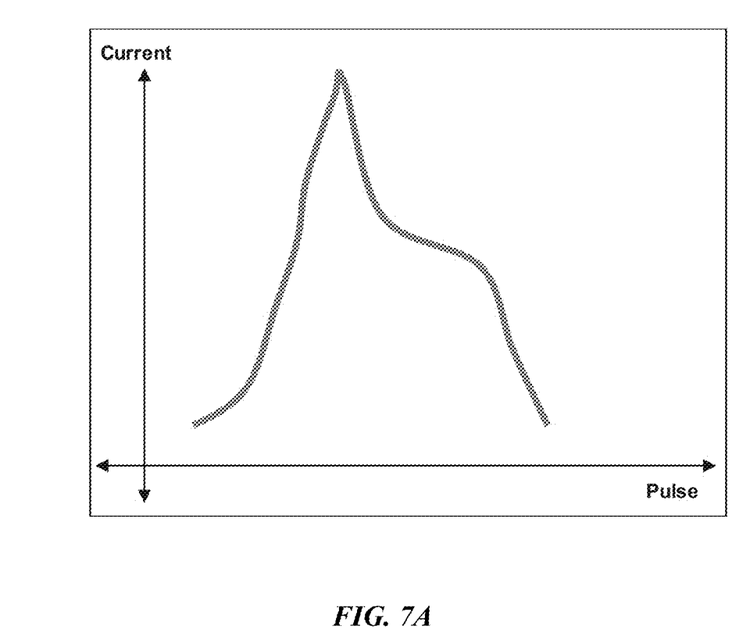
FIGS. 7A-7B show charts of structures performing neuromorphic operations according to some embodiments of the present technology.
Figure 7B:
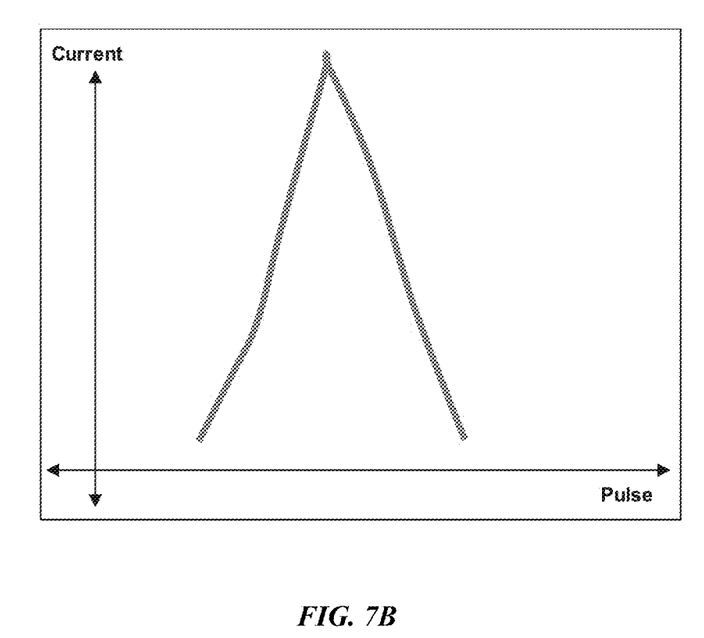

FIGS. 7A-7B show charts of device operations for neuromorphic applications according to some embodiments of the present technology. FIG. 7A may illustrate a device without an additional resistive layer according to some embodiments of the present technology, and FIG. 7B may illustrate a device incorporating a resistive layer between the first oxide layer and an electrode of the device. As illustrated, although the device without the resistive layer provides the current profiles as discussed previously to facilitate analog switching, incorporating a resistive layer may further modify current-voltage profiles of the device. This may allow more flexibility and control over intermediate states, by allowing the linearity of conduction through the device stack to be modified and straightened, which may produce further stability and control over voltage pulses to adjust between intermediate states of the device. Consequently, by producing devices for neuromorphic applications according to some embodiments of the present technology, volume switching may be provided that allows increased bits per cell operation, and improved characteristics over filamentary resistive devices.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor structure for neuromorphic applications, the semiconductor structure comprising:
    a first layer overlying a substrate material, wherein the first layer comprises a first oxide material, and wherein the first layer is formed in contact with the substrate material;
    a second layer disposed adjacent the first layer, wherein the second layer comprises a second oxide material; and
    an electrode material deposited overlying the second layer;

wherein the first oxide material and the second oxide material are characterized by:
an oxygen affinity of the second oxide material relative to an oxygen affinity of the first oxide material causing an exchange between the second oxide material and the first oxide material sufficient to cause bulk switching in the semiconductor structure and prevent the formation of a filament when a set current is applied to the semiconductor structure.

2. The semiconductor structure for neuromorphic applications of claim 1, wherein the substrate material in contact with the first layer comprises an electrode material.

3. The semiconductor structure for neuromorphic applications of claim 2, wherein the electrode material comprises at least one of platinum, titanium nitride, or tantalum nitride.

4. The semiconductor structure for neuromorphic applications of claim 1, wherein the first oxide material and the second oxide material comprise one or more of titanium oxide, hafnium oxide, silicon oxide, zirconium oxide, aluminum oxide, magnesium oxide, tantalum oxide, dysprosium oxide, scandium oxide, or lanthanum oxide.

5. The semiconductor structure for neuromorphic applications of claim 4, wherein the first layer comprises silicon oxide, and wherein the second layer comprises titanium oxide.

6. The semiconductor structure for neuromorphic applications of claim 1, further comprising a resistive material disposed between the first layer and the substrate material.

7. The semiconductor structure for neuromorphic applications of claim 6, wherein the resistive material comprises one or more of silicon, germanium, gallium, or carbon.

8. The semiconductor structure for neuromorphic applications of claim 7, wherein the resistive material comprises amorphous silicon.

9. The semiconductor structure for neuromorphic applications of claim 1, wherein a set and reset current for the semiconductor structure at 1 V turn-on voltage is less than 100 µA.

10. The semiconductor structure for neuromorphic applications of claim 1, wherein the first oxide material and the second oxide material are further characterized by:
the oxygen affinity of the first oxide layer being sufficient to retain oxygen received from the second oxide layer when the set current is no longer applied to the semiconductor structure and allow the semiconductor device to store more than two storage states.

* * * * *